United States Patent [19]

Hong et al.

[11] Patent Number: 5,726,070
[45] Date of Patent: Mar. 10, 1998

[54] SILICON-RICH TUNNEL OXIDE FORMED BY OXYGEN IMPLANTATION FOR FLASH EEPROM

[75] Inventors: Gary Hong; Ching-Hsiang Hsu, both of Hsin-Chu, Taiwan

[73] Assignee: United Microelectronics Corporation, Hsin-Chu, Taiwan

[21] Appl. No.: 622,692

[22] Filed: Mar. 26, 1996

Related U.S. Application Data

[63] Continuation of Ser. No. 524,312, Sep. 6, 1995, abandoned.
[51] Int. Cl.$^6$ .................................... H01L 21/8247
[52] U.S. Cl. ...................... 437/43; 437/24; 437/239; 437/978
[58] Field of Search .................... 437/24, 25, 43, 437/238, 239, 978

[56] References Cited

U.S. PATENT DOCUMENTS 4,849,248  7/1989  Hashimoto ..................... 437/238
5,298,447  3/1994  Hong .............................. 437/43
5,371,027  12/1994  Walker et al. .................. 437/43

OTHER PUBLICATIONS

H.E. Maes, J. Withers & G. Groeseneken, "Trends in Non-Volatile Memory Devices and Technologies", Solid State Devices, pp. 157–168 (1988).

*Primary Examiner*—Chandra Chaudhari
*Attorney, Agent, or Firm*—Meltzer, Lippe, Goldstein, et al.

[57] ABSTRACT

A process for forming an EEPROM having silicon rich tunnel oxide is disclosed. This oxide is used in the formation of flash EEPROMs and results in high tunneling current at low voltages. The oxide also results in EEPROMs having good endurance. A layer of silicon enriched with oxygen is formed between the substrate and the insulating layer separating the substrate from the floating gate.

8 Claims, 3 Drawing Sheets

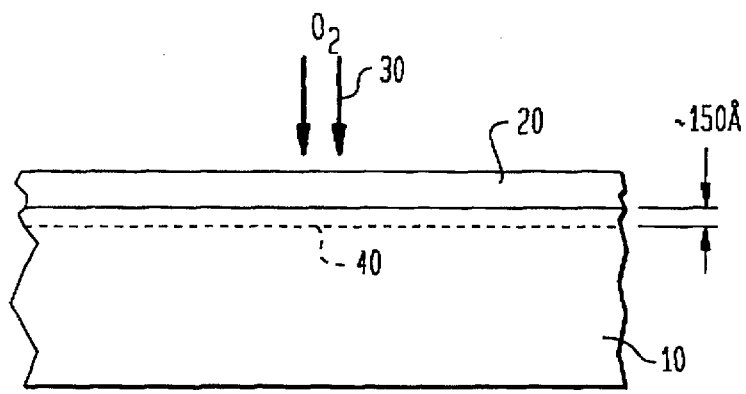
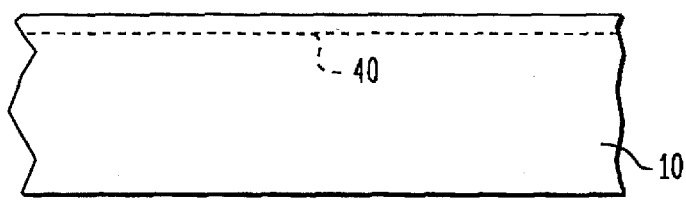
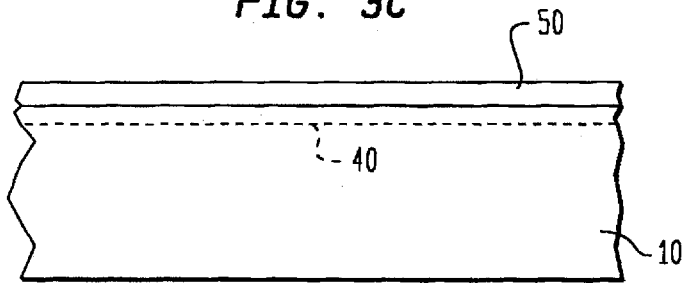

SILICON-RICH TUNNEL OXIDE FORMED BY OXYGEN IMPLANTATION FOR FLASH EEPROM

This is a continuation of application Ser. No. 08/524,312, now abandoned filed Sep. 6, 1995.

FIELD OF THE INVENTION

This invention relates to a structure having and process of making a silicon rich tunnel oxide for Flash EEPROM applications. Specifically, this invention results in high tunneling current at low voltages and good endurance.

BACKGROUND OF THE INVENTION

A conventional flash memory cell is illustrated in FIG. 1. The EEPROM comprises a substrate 100 having a channel 101, a source 102 on one side of the channel and a drain 103 on the other side of the channel. Illustratively, the substrate is p-type and the source and drain are $N^+$. A gate oxide 104 is formed over the substrate 100 and the source 102 and drain 103. A floating gate 105 is disposed on the gate oxide 104, located over the channel 101. A control gate 106 is formed over the floating gate 105. The control gate 106 is separated from the floating gate by an interpoly dielectric 107, such as oxide-nitride-oxide (ONO), or an insulator such as $SiO_2$. Contacts 108, 109, 110 are formed for the source 102, gate 106 and drain 103, respectively.

Flash memories are high-density non-volatile semiconductor memories which offer fast access times. The cell is programmed when charge is stored in the floating gate and unprogrammed when the floating gate is discharged. Generally, the charge is transferred into and out of the floating gate through a thin oxide region.

Single transistor flash memory cells are programmed by the application of a positive potential to their drain region and a programming potential to their control gate. This causes the electrons to be transferred onto the floating gate. The cells are erased by a positive potential application to the source region wherein the control gate is grounded and the drain region is left floating. This causes the electrons on the floating gate to tunnel through the gate oxide into the channel and source region.

The transfer of charge occurs due to a phenomena called tunneling. See H. Maes, J. Withers & G. Groeseneken, Trends in Non-volatile Memory Devices and Technologies", Solid State Devices page 157–168 (1988). For tunneling to occur, two basic requirements must be met: 1) a thin potential barrier and 2) a large number of electrons available to tunnel on one side of the barrier and a large number of empty states or holes into which the electrons tunnel on the other side of the barrier. The smaller the thickness of the potential barrier, the larger the probability of tunneling. The carrier must have an energy greater then the barrier to appear on the other side or, if the barrier is extremely thin, the carrier may tunnel through.

In current flash memory cells, thermal oxide is often used as a tunnel dielectric. The magnitude of the tunneling current is limited by the maximum field which can be applied to the oxide without significantly degrading its quality. Therefore, high voltage is indispensable for obtaining higher erase or programming current.

It is an object of this invention to provide a tunnel oxide which can result in high tunneling current at lower voltages and good endurance at low voltages.

SUMMARY OF THE INVENTION

The present invention achieves this objective and others by providing a silicon rich tunnel oxide. An inventive process for forming this oxide is provided. The process comprises: Depositing a layer of $SiO_2$ on a silicon substrate. Implanting $O_2$ in the substrate through the $SiO_2$ layer. This forms implanted oxygen in the silicon substrate. Stripping the $SiO_2$ layer and growing a new layer of $SiO_2$ on the substrate. Annealing the substrate and the new $SiO_2$ layer to form a layer of silicon enriched with oxygen ("Si—O") between the substrate and the $SiO_2$ layer. During annealing, the silicon (of the substrate) and the implanted oxygen react to a point where a layer of oxide with unreacted silicon is formed, i.e., silicon enriched oxide. This occurs because not enough oxygen is implanted to react completely with the silicon.

BRIEF DESCRIPTION OF THE DRAWINGS

FIGS. 3(A)–(E) illustrate the process of the present invention, and

DETAILED DESCRIPTION OF THE PRESENT INVENTION

Figure 1:
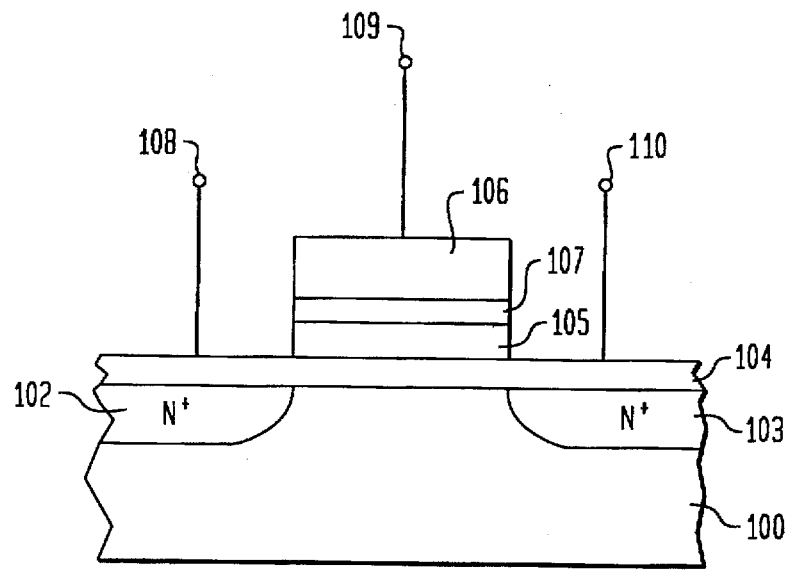
FIG. 1 illustrates a conventional flash memory structure.
Figure 2:
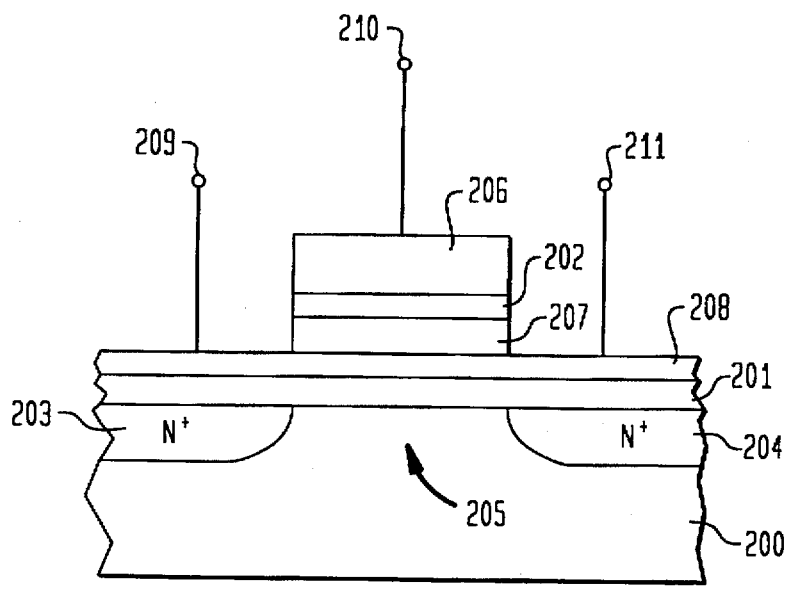
FIG. 2 illustrates a flash memory structure of the present invention.

A flash memory structure of the present invention is illustrated in FIG. 2. This structure comprises a substrate 200 of a first dopant type. For example, the substrate could be P-type silicon with a doping concentration of about $5E15/cm^3$. A source 203 and a drain 204 of a second dopant type are formed in the substrate with a channel 205 formed between them. The second dopant type, for example, is $N^+$-type. A layer of silicon enriched oxide 201 is formed on the surface of the substrate 200. A gate oxide 208 is formed over the silicon enriched oxide layer 201. A floating gate 207 is formed over the channel 205. The floating gate 207 can be formed by a layer of polysilicon having a thickness of approximately 1000 Å. A control gate 206 is formed over the floating gate 207. The control gate 206 is insulated from the floating gate 207 by an interpoly dielectric or insulating layer 202. The insulating layer 202 can be ONO having a thickness of approximately 200 Å. The contacts 209, 210, 211 for the flash memory cell are made by conventional processes, such as metallization.

Referring to FIG. 3(A), the starting point for the process is a P-type, for example, silicon substrate 10 having a doping concentration of about $5E15/cm^3$–$5E16/cm^3$. A layer of silicon dioxide 20 ($SiO_2$) is deposited on the surface of the substrate 10 to a thickness of about 1000 Å (Angstroms). Next, $O_2$ is ion implanted, as indicated by arrows 30, at approximately 50 kev, through the $SiO_2$ layer 20. The dose of the $O_2$ implant is approximately between $10^{16}/cm^2$ and $10^{18}/cm^2$. The $O_2$ needs to penetrate into the silicon substrate 10 to a depth of at least 100 Å to 150 Å to ensure the subsequent formation of silicon rich oxide ("SRO"), as described below. A layer of silicon implanted with oxygen 40 is thereby formed between the $SiO_2$ 20 and the Silicon substrate 10.

In the next step of the process, the $SiO_2$ layer 30 is stripped, leaving a structure composed of the silicon substrate 10 and the layer 40 of silicon implanted with oxygen, as shown in FIG. 3(B).

Referring to FIG. 3(C), a new layer of $SiO_2$ 50 is grown on the surface. The $SiO_2$ layer 50 is grown to a thickness of approximately 100 Å by thermal oxidation. This oxidation process will partially oxidize the oxygen-implanted silicon 40.

Figure 3D:
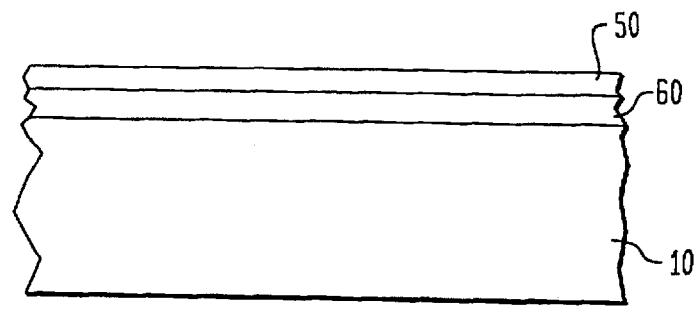

Referring to FIG. 3(D), the oxidized silicon structure is annealed in a $N_2$ atmosphere. The annealing forms a layer 60 of silicon enriched oxide ("Si—O"), having a thickness of approximately between 100 Å and 200 Å. This Si—O layer 60 enhances the tunneling. The annealing takes place at a temperature of about 750° C.~950° C. for a duration of about 60 minutes. During annealing, the silicon and oxygen react to form the silicon enriched oxide layer 60 which is a layer of oxide with unreacted silicon. This occurs because not enough oxygen $O_2$ is implanted to completely react with the silicon.

Figure 3E:
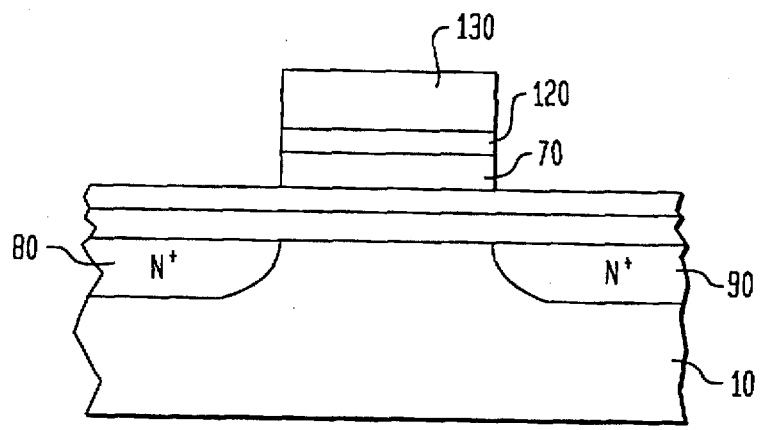

Finally, a flash memory cell is formed by conventional means such as poly gate 70 formation, as shown in FIG. 3(E). Source 80 and drain 90 of the cell are formed by ion implantation. For example, arsenic ions are implanted. The ion implantation dose of arsenic ions occurs at approximately 50 kev and a dose unit of approximately $5.0E15/cm^2$. An insulating layer 120 is formed over the gate 70. This insulating layer 120 can be ONO. A control gate 130 is formed over the insulating layer 120.

Figure 4:
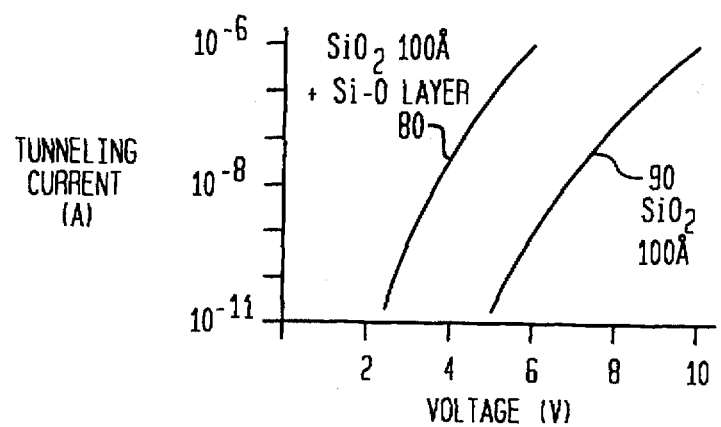
FIG. 4 illustrates the characteristics of the F-N tunneling current for the present invention.

FIG. 4 compares the characteristics of Fowler-Nordheim ("F-N") tunneling with $SiO_2$+Si—O layers 80, as per the present invention, to F-N tunneling with only a conventional $SiO_2$ layer 90. The $SiO_2$ layer in both situations is approximately 100 Å in thickness. The graph charts tunneling current on the vertical axis and voltage on the horizontal axis. As is apparent, the present invention yields equally high tunneling current but at substantially lower voltages.

The same amount of F-N tunneling current will occur at much lower voltage for the inventive $SiO_2$+Si—O structure as compared with that of a conventional $SiO_2$ structure. Higher current injection efficiency for $SiO_2$+Si—O layer is due to higher electric field at the surface of silicon islands in the Si—O layer. Therefore, in Flash EEPROM applications, both the programming and erase voltage can be reduced by using the $SiO_2$+Si—O structure and process of the present invention.

Finally, the above described embodiment of the present invention is intended to be illustrative only. Numerous alternative embodiments may be devised by those skilled in the art without departing from the spirit and scope of the following claims.

We claim:

1. A process for forming a tunnel oxide for a flash memory cell, comprising depositing a first $SiO_2$ layer on a silicon substrate having a first dopant type, implanting $O_2$ in said substrate through said first $SiO_2$ layer, to form a layer of silicon implanted with oxygen, stripping said first $SiO_2$ layer, growing a second $SiO_2$ layer on said substrate, and annealing said substrate and said second $SiO_2$ layer to form a silicon enriched oxide layer between said substrate and said second $SiO_2$ layer.

2. The process of claim 1, wherein said $O_2$ penetrates into said silicon substrate to a depth of at least 100 Å to ensure formation of said silicon enriched rich oxide layer.

3. The process of claim 1, wherein said second $SiO_2$ layer is deposited to a thickness of approximately 100 Å.

4. The process of claim 2, wherein said $O_2$ implantation is at an energy of approximately 50 kev and a dose unit in the range of $10^{16}$ to $10^{18}/cm^2$.

5. The process of claim 1, wherein said annealing takes place at a temperature of approximately 750° C. to 950° C. for a duration of approximately 60 minutes.

6. The process of claim 1, wherein said second $SiO_2$ layer is grown by thermal oxidation.

7. The process of claim 6, wherein said thermal oxidation partially oxidizes said silicon layer implanted with oxygen.

8. The process of claim 1, further comprises forming a floating gate on said second $SiO_2$ layer, forming a dielectric layer on said floating gate and forming a control gate on said dielectric layer.

* * * * *